July 16, 1963 R. N. NOYCE 3,098,160

FIELD CONTROLLED AVALANCHE SEMICONDUCTIVE DEVICE

Filed Feb. 24, 1958 2 Sheets-Sheet 1

INVENTOR.
Robert N. Noyce
BY Flehr & Swain
ATTORNEYS

July 16, 1963 R. N. NOYCE 3,098,160

FIELD CONTROLLED AVALANCHE SEMICONDUCTIVE DEVICE

Filed Feb. 24, 1958 2 Sheets-Sheet 2

INVENTOR.
Robert N. Noyce
BY Flehr and Swain
ATTORNEYS

United States Patent Office 3,098,160
Patented July 16, 1963

3,098,160

FIELD CONTROLLED AVALANCHE SEMICONDUCTIVE DEVICE

Robert N. Noyce, Los Altos, Calif., assignor, by mesne assignments, to Clevite Corporation, Cleveland, Ohio, a corporation of Ohio Filed Feb. 24, 1958, Ser. No. 716,913
8 Claims. (Cl. 307—88.5)

This invention relates to a semiconductive device, and more particularly to a semiconductive device which may be operated at relatively high frequencies.

In the conventional junction transistor minority carriers are injected into a base region by applying a forward bias across the emitter junction. These carriers diffuse through a base region and are collected across a reverse biased collector junction. Since the device depends primarily upon the diffusion of carriers, a slow process, its upper frequency is limited.

It is a general object of the present invention to provide a semiconductive device with improved frequency characteristics.

It is another object of the present invention to provide a a semiconductive device in which carriers flow to a collector under the influence of applied fields rather than by diffusion.

It is another object of the present invention to provide a semiconductive junction device in which carriers are generated in the space charge region of a collector and flow to the collector under the influence of the applied field.

These and other objects of the invention will become more clearly apparent from the following description when taken in conjunction with the accompanying drawing.

Referring to the drawing.

Generally, the device of the present invention operates by generating carriers in a space charge region of a reversely biased p-n junction which acts as the collector junction. These carriers flow across this junction under the influence of the applied field to the collector region. The transit times involved are extremely short being in the order of $10^{-10}$ microseconds or less.

The carriers are created in the space charge region of the junction by the "avalanche" or "Zener" effect which occur at extremely high electric field. As is well known, when a high field is placed across a semiconductor region, the carriers flowing through this region achieve high enough energy to generate hole electron pairs in the region. Alternately, electrons may tunnel through the forbidden energy gap and appear in the conduction band, likewise creating hole electron pairs.

Figure 1:
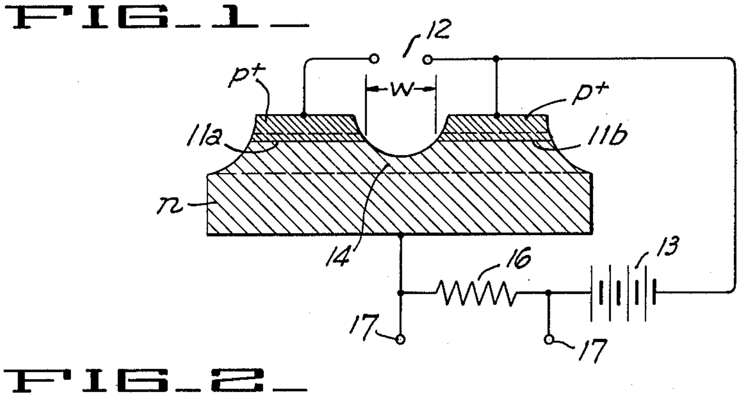
FIGURE 1 is a sectional view showing the device of the invention connected in a suitable circuit.

A semiconductive device incorporating the invention is illustrated in FIGURE 1. The device comprises a region of one conductivity type, for example, n-type, and a pair of regions of opposite conductivity type, for example, p-type, forming junctions 11*a* and 11*b* therewith. In the embodiment illustrated, the n-type region supports the remainder of the structure. The p-type regions are spaced apart on the n-type region whereby they are electrically connected through a small portion of the n-type supporting region. Preferably, the p-type regions are highly doped as indicated by the positive superscript. Suitable ohmic contact is made to each of the three regions whereby electrical connection can be made to the device.

The input signal to be amplified is applied to the terminals 12 connected to the p-type regions and creates an electric field in the underlying n-type region particularly in the portion of the n-type region between the two junctions 11*a* and 11*b*, sufficient to cause avalanche in this region. An analogy may be drawn with a conventional transistor. One of the p-type regions acts as an emitter and the other may be regarded as a base region. It is, of course, to be observed that there is complete symmetry in the two regions and that their roles may be interchanged. However, the analogy to a conventional transistor aids in selecting various circuit configurations similar to those for conventional transistors. The charcteristics obtained are similar. Thus, a grounded emitter configuration may be employed where it is desired to achieve current gain.

The separation between the two p-type regions (junctions) is indicated by the distance $w$. If this distance is relatively short, a relatively high field will be present in this portion of the n-type region adjacent to the most negatively biased p-type region for moderate voltages applied between the p-type regions. Carriers flowing in this region reach sufficiently high velocities to cause avalanche and the generation of hole electron pairs. The avalanche will set in before the field in the underlying p-n junction is high enough to cause avalanche or tunnelling through the junctions 11*a* and/or 11*b*.

A suitable bias voltage 13 is applied across the p-n junctions formed between the p-type regions and the underlying n-type region. This voltage serves to form a space charge region 14 indicated roughly by the dotted lines. The applied voltage between these junctions will also serve to create a component of electric field in the portion of the n-type region between the same which voltage will aid in setting up the avalanche condition in this portion of the n-type region. When avalanche or tunnelling occurs in this portion of the n-type region, both holes and electrons are created in the space charge region. If the n-type region is biased more positively than either p-type region, the electrons created will flow into the n-type region. Thus, the region serves to collect electrons. By analogy it functions as the collector for a conventional transistor does. The current flowing in the n-type region is primarily determined by the voltage applied between the terminals 12. Current flows through the load 16. An amplified output signal may be obtained across the terminals 17. The voltage gain of the device, when operated as illustrated, is very good.

To repeat, a complete analogy may be drawn between the device of the present invention and a conventional transistor. In the present device an emitter and base, the two regions of the same conductivity type, form junctions with a region of opposite conductivity type. The two regions of the same conductivity type act as the emitter and base regions while the region of opposite conductivity type acts as a collector. The device of the invention is either an n-n-p or a p-p-n type device in comparison to an n-p-n or p-n-p type transistor. With this analogy, the parameters obtained may be compared to those for a transistor.

The device illustrated in FIGURE 1 may be constructed in the following manner: A relatively massive n-type block is placed in a diffusion oven and exposed to a source of acceptors such that a p-type layer is formed on the surface of the block. The block is lapped, ground, etched or the like to remove the p-type layer from all surfaces with the exception of one. A groove is then etched, cut, sawed or otherwise formed which extends through the p-type layer into the underlying n-type block to produce a structure of the type illustrated in FIGURE 1.

Figure 2:
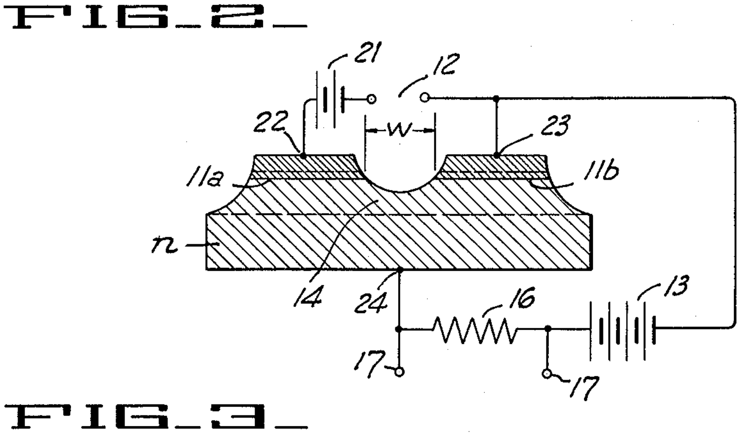
FIGURE 2 shows a semiconductor device of the invention connected in another circuit configuration.

By suitably applying bias to the device of FIGURE 1, the device may be caused to give a current gain which is greater than one. A connection similar to the grounded emitter configuration is shown in FIGURE 2. A bias source 21 applies a bias between the two p-type regions. When avalanche occurs, the carriers created flow under the influence of the field, as previously described. The holes flow towards the more negative potential, and the electrons towards the more positive potential. The terminal 22 is more positive than the terminal 23 and more holes will flow out of terminal 22 than will flow out of terminal 23. The sum of these two being equal to the electrons flowing to the terminal 24 and through the load resistor 16.

Figure 3:
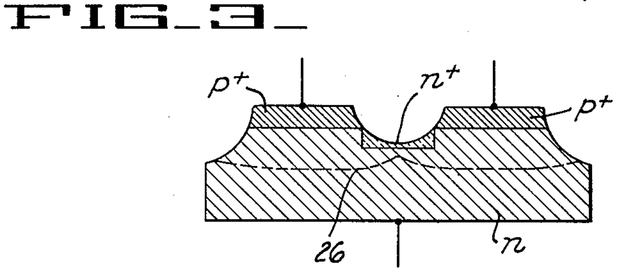
FIGURE 3 shows another embodiment of the invention.
Figure 4:
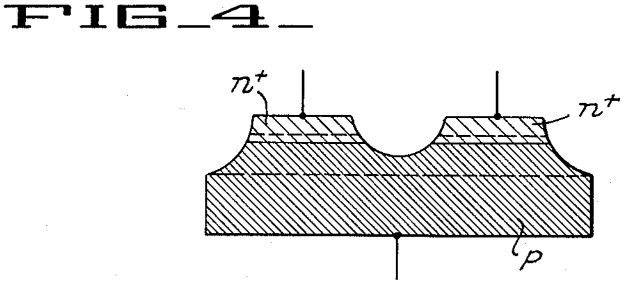
FIGURE 4 shows a device similar to that of FIGURE 1 but including opposite conductivity type regions.

In certain instances "punch-through" may occur. "Punch-through" is the flow of carriers from one p-type region to the other, through the collector body, which does not contribute to current through the associated load. It is desirable that the immediate region between the input electrodes be more highly doped than the collector body to counteract this effect. A structure of the type shown in FIGURE 3 achieves this and also localizes the fields more strongly. In this case the highest field lies in the junction between the n+ region and one of the p-type regions. The n+ region is formed between the two p+ regions by suitable techniques as, for example, alloying techniques. This region then tends to concentrate the electric field as is indicated by the dotted line 26. This region should be small in extent in order that all the donors be ionized. The devices described are of the p-p-n type. However, it is apparent that devices of the n-n-p type will function in the same manner. A n-n-p type device is illustrated in FIGURE 4.

Figure 5:
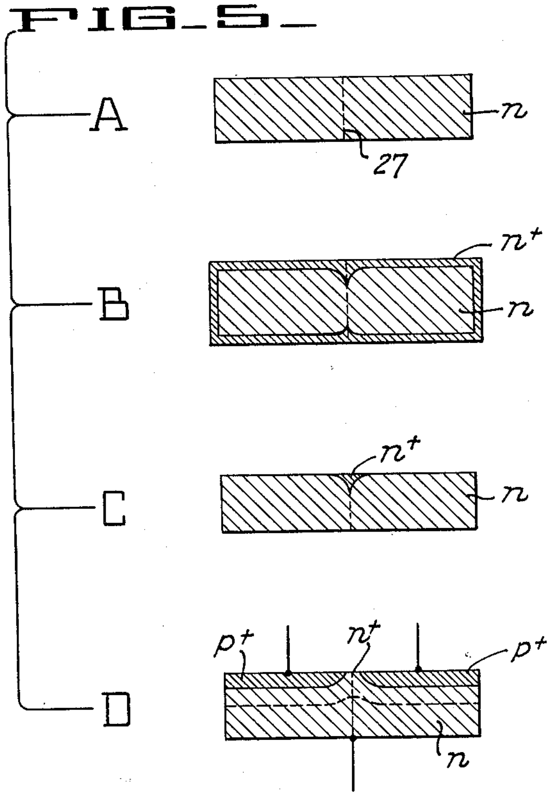
FIGURE 5 shows the method of construction of another device incorporating the invention.

As previously described, hole electron pairs may be created by tunnelling. This has the advantage that in operation the device is less noisy and, therefore, permits the amplification of lower input voltages. In order to achieve this, extremely narrow regions are required. Referring to FIGURE 5, the construction of such a device is schematically illustrated. In FIGURE 5A a block of n-type semiconductive material including a grain boundary 27 extending therethrough is selected as the starting block. The block is then subjected to a diffusion in the presence of donors, for example, antimony. This creates an n+ region over the complete surface of the device, FIGURE 5B. The structure of FIGURE 5B is then subjected to a lapping operation whereby the n+ layer is removed from all surfaces as indicated to leave an n+ region at the grain boundary as illustrated in FIGURE 5C. The resulting block, FIGURE 5C, is then subjected to a diffusion in the presence of acceptors, for example, boron to form p+ regions. The p+ regions are separated by a relatively thin region of n+ material and are supported on a base of n-type material as illustrated in FIGURE 5D. This provides a relatively thin n+ region separating the p+ regions.

Thus, it is seen that there is provided a semiconductive junction device in which carriers are generated in the space charge region of a collector junction by avalanche or tunnelling. The carriers are swept to the collector by the fields existing. A device suitable for operation at relatively high frequencies is provided.

I claim:

1. A semiconductor device comprising a region of one conductivity type, first and second spaced regions of opposite conductivity type each forming a junction therewith and disposed on one surface thereof, said first and second regions being closely spaced with respect to one another, means for applying an input signal between said two regions of opposite conductivity type, said signal creating a high electric field in said region of one conductivity type whereby carriers flowing between said first and second regions serve to set up avalanche in the portion of the region of one conductivity type between said first and second regions, and means for reverse biasing the junctions between said one region of one conductivity type and said first and second regions of opposite conductivity type.

2. A semiconductor device comprising a first region of one conductivity type, second and third spaced apart regions of opposite conductivity type each forming a junction with one surface thereof, said second and third regions being closely spaced with respect to one another whereby a small portion of said first region separates the same means for reverse biasing said junctions to form a space charge layer in the first region, and means for applying a signal between said second and third region whereby carriers flow through said first region in the space charge layer, said carriers serving to generate secondary carriers, said first region serving to collect the secondary carriers from said space charge layer.

3. A semiconductive device comprising a first region of one conductivity type, second and third closely spaced regions of opposite conductivity type disposed on one surface of and forming junctions with said first region, means for applying a signal voltage between said spaced regions whereby carriers flow through the first region in a confined portion of the first region disposed between the spaced regions, means for applying a voltage between said first region and said second and third spaced regions whereby the junctions are reverse biased, the spacing of said second and third regions being such that the electric field created in the underlying portion of the first region causes the carriers flowing between the second and third regions to generate carriers by avalanche multiplication.

4. A semiconductive device as in claim 3 in which said portion of the first region includes a region of material of higher impurity concentration.

5. A semiconductive device comprising a first region of one conductivity type, second and third closely spaced regions of opposite conductivity type disposed on one surface of and forming junctions with said first region, means for applying a voltage between said first region and said second and third regions which serves to reverse bias the junctions and form a space charge region in said first region, means for applying a signal voltage between said second and third spaced regions whereby carriers flow through a portion of the first region between the spaced regions and in the space charge region, the spacing of said second and third regions being such that the electric field in said portion of the first region causes carriers to be generated by avalanche multiplication, said carriers being collected from the space charge region by said first region.

6. A semiconductive device as in claim 5 in which said portion of the first region includes a region of material of higher impurity concentration.

7. A semiconductive device comprising a region of one conductivity type, first and second spaced diffusion regions of opposite conductivity type forming junctions on one surface thereof, said first and second regions being closely spaced with respect to one another, means for applying an input signal between the spaced diffusion regions, said signal creating a high electric field in said region of one conductivity type between the spaced diffusion regions whereby carriers flowing between said first and second diffusion regions serve to generate carriers by avalanche multiplication in a portion of the region of one conductivity type, and means for applying a voltage to said region of one conductivity type which causes the region to collect carriers of one type formed in said region of one conductivity type.

8. A semiconductive device comprising a region of one conductivity type, first and second regions of opposite conductivity type forming a junction with the region of one conductivity type and including a portion of said region therebetween, means for applying a signal voltage between said first and second spaced regions, the spacing of said regions and the impurity concentration of the portion of one conductivity type therebetween being such that the electric fields set up cause the generation of carriers by secondary generation in said portion, and means for applying a voltage to said region of one conductivity type such that it collects carriers generated in said portion.

References Cited in the file of this patent

UNITED STATES PATENTS

| | | |
|---|---|---|
| 2,402,661 | Ohl | June 25, 1946 |
| 2,663,830 | Oliver | Dec. 22, 1953 |
| 2,689,930 | Hall | Sept. 21, 1954 |
| 2,764,642 | Shockley | Sept. 25, 1956 |
| 2,790,034 | McAfee | Apr. 23, 1957 |
| 2,791,759 | Brown | May 7, 1957 |
| 2,805,347 | Haynes et al. | Sept. 3, 1957 |
| 2,820,154 | Kurshan | Jan. 14, 1958 |
| 2,936,425 | Shockley | May 10, 1960 |